(12) United States Patent
Risaki

(10) Patent No.: US 10,411,137 B2
(45) Date of Patent: Sep. 10, 2019

(54) SEMICONDUCTOR MEMORY DEVICE AND METHOD OF MANUFACTURING THE SAME

(71) Applicant: SII Semiconductor Corporation, Chiba-shi, Chiba (JP)

(72) Inventor: Tomomitsu Risaki, Chiba (JP)

(73) Assignee: ABLIC Inc. (JP)

( * ) Notice: Subject to any disclaimer, the term of this patent is extended or adjusted under 35 U.S.C. 154(b) by 22 days.

(21) Appl. No.: 15/362,467

(22) Filed: Nov. 28, 2016

(65) Prior Publication Data

US 2017/0077309 A1 Mar. 16, 2017

Related U.S. Application Data

(62) Division of application No. 14/602,535, filed on Jan. 22, 2015, now abandoned.

(30) Foreign Application Priority Data

Feb. 3, 2014 (JP) .................. 2014-018756

(51) Int. Cl.
  *H01L 29/788* (2006.01)
  *H01L 27/11521* (2017.01)
  *H01L 29/66* (2006.01)
  *H01L 29/423* (2006.01)
  *H01L 21/265* (2006.01)
  *H01L 27/11524* (2017.01)
  *H01L 29/06* (2006.01)
  *H01L 29/78* (2006.01)

(52) U.S. Cl.
  CPC .... *H01L 29/7883* (2013.01); *H01L 21/26586* (2013.01); *H01L 27/11521* (2013.01); *H01L 27/11524* (2013.01); *H01L 29/0653* (2013.01); *H01L 29/42344* (2013.01); *H01L 29/66795* (2013.01); *H01L 29/66825* (2013.01); *H01L 29/7851* (2013.01); *H01L 29/785* (2013.01)

(58) Field of Classification Search
  CPC .......... H01L 29/7883; H01L 21/26586; H01L 27/11521; H01L 27/11524; H01L 29/0653; H01L 29/42344; H01L 29/66795
  USPC ....................................................... 257/316
  See application file for complete search history.

(56) References Cited

U.S. PATENT DOCUMENTS

| | | | |
|---|---|---|---|
| 6,867,460 B1 | 3/2005 | Anderson et al. | 257/351 |
| 6,914,288 B2 | 7/2005 | Itou et al. | 257/314 |
| 7,009,250 B1 | 3/2006 | Mouli | 257/347 |

(Continued)

OTHER PUBLICATIONS

Patent Abstracts of Japan, Publication No. 2004-071077, Publication Date Mar. 4, 2004.

*Primary Examiner* — Ori Nadav
(74) *Attorney, Agent, or Firm* — Adams & Wilks

(57) ABSTRACT

Provided is a semiconductor device, which prevents unnecessary voltage drop in a MOS transistor that is connected in series in a location between a booster circuit and a memory main body portion, to thereby operate on a low voltage and improve the ON/OFF ratio so that chip size shrinking and memory performance improvement are accomplished simultaneously. In a semiconductor memory device including a memory transistor portion and a select transistor portion, at least the select transistor portion is formed of a fin-shaped single-crystal semiconductor thin film.

2 Claims, 10 Drawing Sheets

(56) References Cited

U.S. PATENT DOCUMENTS

2007/0272971 A1* 11/2007 Lee .................. H01L 27/105
　　　　　　　　　　　　　　　　　　　　257/321
2012/0008367 A1　　1/2012 Kajiyama .................. 365/148

* cited by examiner

SEMICONDUCTOR MEMORY DEVICE AND METHOD OF MANUFACTURING THE SAME

BACKGROUND OF THE INVENTION

1. Field of the Invention

The present invention relates to a semiconductor memory device.

2. Description of the Related Art

A related-art semiconductor memory device is described taking an EEPROM as an example. FIGS. 8A to 8C are conceptual diagrams of a related-art EEPROM that has a general structure as described in Japanese Patent Application Laid-open No. 2004-71077. FIG. 8A is a plan view, FIG. 8B is a sectional view taken along the line A-A' of FIG. 8A, and FIG. 8C is a perspective view.

The EEPROM includes a memory main body portion 02 and a select gate transistor portion 01 for selecting the memory main body portion 02. In the memory main body portion 02, an electrode called a floating gate 12, which accumulates electric charges, is formed. The state of the memory is changed depending on an amount of the electric charges. Here, accumulating electric charges in the floating gate 12 puts the memory main body portion 02 into an enhancement mode, which is regarded as a "1" state, and accumulating holes in the floating gate 12 puts the memory main body portion 02 into a depression mode, which is regarded as a "0" state. Writing in the "1" state involves applying a plus voltage called Vpp to a select gate 13 and a control gate 11, setting a drain $n^+$ region 04, a source $n^+$ region 08, and a substrate 05 to GND, and injecting electrons from a tunnel drain n region 06 into the floating gate 12 via a tunnel oxide film 07. Writing in the "0" state involves applying Vpp to the select gate 13 and the drain $n^+$ region 04, setting the control gate 11 and the substrate 05 to GND, setting the source $n^+$ region 08 to a floating voltage, and injecting holes from a tunnel drain n region 06 into the floating gate 12 via the tunnel oxide film 07.

The voltage Vpp in a write needs to be high enough for electric charges to pass through the tunnel oxide film 07. In general, Vpp required when the thickness of the tunnel oxide film is 100 Å is 15 V to 20 V. The voltage Vpp is generated by a booster circuit, which means that all devices from the booster circuit to the memory main body portion 02 need to have a withstand voltage of Vpp or higher. This limitation on withstand voltage is an obstacle to a reduction in device size for the purpose of chip size shrinking, and lowering the voltage Vpp is therefore demanded.

However, if the voltage Vpp is simply lowered, electric charge injection to the floating gate, which is important as a memory function, cannot be accomplished fully. Accordingly, ensuring sufficient injection by thinning the tunnel oxide film 07 is commonly practiced.

The thinning of the tunnel oxide film 07 described above, however, impairs retention characteristics of the memory and accordingly lowers the reliability of the memory.

In addition to this hard-to-overcome trade-off relation, an unnecessary voltage drop in a MOS transistor that is connected in series in a location between the booster circuit and the memory main body portion 02 presents further obstacle to the fulfillment of the request to lower the device withstand voltage. The MOS transistor corresponds to, for example, the select gate transistor portion 01 of FIGS. 8A to 8C.

To give an example, consider a case where, when Vpp is applied to the select gate 13 and the drain $n^+$ region 04 in a write in the "0" state, the electric potential of the tunnel drain n region 06 rises higher than the GND potential of the substrate 05, thereby accidentally applying a back gate voltage to the select gate transistor portion 01, and causing a threshold Vth of the select gate transistor portion 01 to rise to Vth'. Then, the voltage drops by Vth' in the select gate transistor portion 01 and only a voltage that is lower than Vpp by Vth' reaches the tunnel train n region 06 (FIG. 10). When, for example, Vth' is 2 V in the case where a sufficient write requires a voltage application of 15 V to the tunnel drain n region 06, applying Vpp that is 15+2=17 V to the drain $n^+$ region 04 is necessary. In short, Vpp that is higher by 2 V than a voltage of 15V that is normally required for a sufficient write needs to be applied to the drain $n^+$ region 04, which necessitates the securing of excess withstand voltage. In order to eliminate this voltage drop in the select gate transistor portion 01 and set Vpp to 15 V, it is only necessary to apply a voltage higher than Vpp to the select gate 13. However, because this voltage is calculated as Vpp+Vth'=15+2=17 V, securing a withstand voltage of 17 V is still necessary and an excess withstand voltage still needs to be secured, which causes difficulty in reducing device size.

This problem is not limited to the select gate transistor portion 01, and occurs in any MOS transistor that is connected in series between an exit of the booster circuit and the select gate 13. In a write in the "1" state, the same problem occurs in any MOS transistor that is connected in series between the exit of the booster circuit and the control gate 11.

The cause of this problem is the rise in Vth due to the back gate effect, as is understood from the description given above. The degree of rise in Vth due to back gate voltage application is generally determined by a series-capacitance relation between a gate oxide film, which is sandwiched between the gate of the MOS transistor and the substrate, and a semiconductor.

FIG. 9A is a sectional view of the select transistor of FIGS. 8A to 8C (a sectional view taken along the line B-B'). FIG. 9B illustrates an equivalent circuit of FIG. 9A. Denoted by Cox is the gate oxide film capacitance, and denoted by Csi is the semiconductor capacitance that is determined by a thickness d of a depletion layer 14.

When the substrate 05 is dropped to GND and the voltage Vpp is applied to the select gate 13, an electric potential difference of Vpp is generated between the gate and the substrate, the voltage Vpp is divided into Cox and Csi, and Vpp=Vox+Vsi is established. The voltages Vox and Vsi are applied to Cox and Csi, respectively. The degree of rise in Vth is greater when Vox is larger.

The voltage Vox is expressed as (Csi/(Cox+Csi))Vpp. Accordingly, the degree of rise in Vth is greater and the problem described above is graver when Cox is smaller and Cis is larger. In other words, increasing Cox while reducing Csi leads to a solution of the problem. Increasing Cox is accomplished by thinning the gate oxide film 03, but there is a limit to the thinning because of the withstand voltage. Reducing Csi, on the other hand, is accomplished by extending the width d of the depletion layer 14 when a channel is formed, which requires lowering the impurity concentration of the semiconductor substrate. Lowering the impurity concentration also has a limit because of its effect on leakage of the MOS transistor.

Thus, shrinking the chip size by lowering the device withstand voltage is very difficult due to various limitations.

SUMMARY OF THE INVENTION

Measure 1

There is provided a semiconductor memory device, including: a memory transistor portion including: a source region of a second conductivity type, which is formed in a surface layer of a semiconductor substrate of a first conductivity type; a tunnel drain region of the second conductivity type, which is formed at a distance from the source region; a floating gate formed above the semiconductor substrate between the source region and the tunnel drain region with a gate oxide film, which includes a tunnel insulating film, interposed between the floating gate and the semiconductor substrate; and a control gate formed above the floating gate with an insulating film interposed between the floating gate and the control gate; and a select transistor portion including: a fin-shaped single-crystal semiconductor thin film of the first conductivity type, which is formed in the semiconductor substrate; a drain region of the second conductivity type, which is formed in a surface layer of the fin-shaped single-crystal semiconductor thin film; and a select gate formed between the drain region and the tunnel drain region, above a upper surface and side surfaces of the fin-shaped single-crystal semiconductor thin film with a select gate oxide film interposed between the select gate and the fin-shaped single-crystal semiconductor thin film.

Measure 2

In the semiconductor memory device of Measure 1, the memory transistor portion includes: a fin-shaped single-crystal semiconductor thin film of a first conductivity type, which is formed in a semiconductor substrate of the first conductivity type; a source region of a second conductivity type, which is formed in a surface layer of the fin-shaped single-crystal semiconductor thin film; a tunnel drain region of the second conductivity type, which is formed at a distance from the source region; a floating gate formed above the fin-shaped single-crystal semiconductor thin film between the source region and the tunnel drain region with a gate oxide film, which includes a tunnel insulating film, interposed between the floating gate and the fin-shaped single-crystal semiconductor thin film; and a control gate formed above the floating gate with an insulating film interposed between the floating gate and the control gate.

Measure 3

In the semiconductor memory device according to Measure 1 or 2: a portion of the select gate that covers the upper surface of the fin-shaped single-crystal semiconductor thin film is extended in a direction of the drain region to form an overhang; and a region lower in concentration than the drain region is formed in a surface layer of the fin-shaped single-crystal semiconductor thin film that is under the overhang.

Measure 4

The semiconductor memory device according to Measure 1 or 2 further includes an STI concave portion formed in the semiconductor substrate, in which: the STI concave portion has an STI internal oxide film embedded therein except for some regions; portions of the select gate that cover the side surfaces of the fin-shaped single-crystal semiconductor thin film in the some regions; and the STI internal oxide film and the select gate are spaced apart from each other in a channel length direction of a select gate transistor.

Measure 5

The semiconductor memory device according to Measure 4 further includes a drain region exposed to a portion on which the select gate oxide film formed on side walls of the STI concave portion and the select gate are spaced apart from each other, the second drain region being formed to have a depth deeper than a depth of the drain region.

Measure 6

In the semiconductor memory device according to Measure 2: portions of the select gate and the floating gate, which cover the upper surface of the fin-shaped single-crystal semiconductor thin film, are extended in a channel length direction of the select gate transistor and the memory transistor portion to form an overhang; and a region lower in concentration than the drain region and the source region is formed in a surface layer of the fin-shaped single-crystal semiconductor thin film that is under the overhang.

Measure 7

The semiconductor memory device according to Measure 2 further includes an STI concave portion formed in the semiconductor substrate, in which: an STI internal oxide film is embedded in the STI concave portion except for some regions, portions of the select gate and the floating gate that cover the side surfaces of the fin-shaped single-crystal semiconductor thin film are formed in the some regions; and the STI internal oxide film is spaced apart from the select gate and the floating gate in a channel length direction of a select gate transistor and the memory transistor portion.

Measure 8

The semiconductor memory device according to Measure 7 further includes a drain region and a source region, which are exposed to a portion in which the select gate oxide film formed on side walls of the STI concave portion and the select gate are spaced apart from each other, the second drain region and the source region being formed to have depths deeper than depths of the drain region and the source region.

Measure 9

In the semiconductor memory device according to any one of Measures 1 to 8, the select gate includes a lower select gate and an upper select gate that is electrically connected to the lower select gate.

Measure 10

There is provided a method of manufacturing a semiconductor memory device, the semiconductor memory device including a memory transistor portion formed in a semiconductor substrate of a first conductivity type and a select transistor portion formed in a fin-shaped single-crystal semiconductor thin film of the first conductivity type, which is formed in the semiconductor substrate, the method including: forming, in a surface layer of the semiconductor substrate, a plurality of parallel low concentration impurity regions of a second conductivity type; forming a plurality of parallel trenches that are orthogonal, in plan, to the plurality of parallel low concentration impurity regions of the second conductivity type; embedding an insulating film in the plurality of parallel trenches; thereafter removing the insulating film from a region for forming the select transistor portion to form STI concave portions and the fin-shaped single-crystal semiconductor thin film; forming, in the region for forming the select transistor portion, a lower select gate above the fin-shaped single-crystal semiconductor thin film with a select gate oxide film interposed between the fin-shaped single-crystal semiconductor thin film and the lower select gate; forming an upper select gate above the lower select gate with the insulating film interposed between the lower select gate and the upper select gate; forming, in a region for forming the memory transistor portion, a gate oxide film on the semiconductor substrate; forming a tunnel insulating film in a part of the gate oxide film; forming a floating gate on the gate oxide film; forming a control gate above the floating gate with an insulating film interposed between the floating gate and the control gate; and forming a high concentration impurity region of the second conductivity type with the upper select gate and the control gate used as a mask.
Measure 11

There is provided a method of manufacturing a semiconductor memory device, the semiconductor memory device including a memory transistor portion and a select transistor portion that are formed in a fin-shaped single-crystal semiconductor thin film of a first conductivity type, which is formed in a semiconductor substrate of the first conductivity type, the method including: forming, in a surface layer of the semiconductor substrate, a plurality of parallel low concentration impurity regions of a second conductivity type; forming a plurality of parallel trenches that are orthogonal, in plan, to the plurality of parallel low concentration impurity regions of the second conductivity type; embedding an insulating film in the plurality of parallel trenches; thereafter removing the insulating film from a region for forming the memory transistor portion and a region for forming the select transistor portion to form STI concave portions and the fin-shaped single-crystal semiconductor thin film; forming, in the region for forming the select transistor portion, a lower select gate above the fin-shaped single-crystal semiconductor thin film with a select gate oxide film interposed between the fin-shaped single-crystal semiconductor thin film and the lower select gate; forming an upper select gate above the lower select gate with an insulating film interposed between the lower select gate and the upper select gate; forming, in a region for forming the memory transistor portion, a gate oxide film on the semiconductor substrate; forming a tunnel insulating film in a part of the gate oxide film; forming a floating gate on the gate oxide film; forming a control gate above the floating gate with an insulating film interposed between the floating gate and the control gate; and forming a high concentration impurity region of the second conductivity type with the upper select gate and the control gate used as a mask.
Measure 12

In the method of manufacturing a semiconductor memory device according to Measure 7 or 8: the forming of the lower select gate above the fin-shaped single-crystal semiconductor thin film, with the select gate oxide film interposed between the fin-shaped single-crystal semiconductor thin film and the lower select gate, and the forming of the floating gate on the gate oxide film are executed simultaneously; and the forming of the upper select gate above the lower select gate, with the insulating film interposed between the lower select gate and the upper select gate, and the forming of the control gate above the floating gate, with the insulating film interposed between the floating gate and the control gate, are executed simultaneously.
Measure 13

In the method of manufacturing a semiconductor memory device according to any one of Measures 7 to 9, the forming of the high concentration impurity region of the second conductivity type comprises using angled ion implantation.

Unnecessary voltage drop can be prevented in a MOS transistor where the threshold has risen due to the back gate effect. This eliminates the need for a device having a voltage higher than a normally necessary memory write voltage, and keeps the device size from increasing unnecessarily. An effect of improving the ON/OFF ratio and an effect of reducing disturbance are also obtained.

BRIEF DESCRIPTION OF THE DRAWINGS

FIG. 1A is a plan view, FIG. 1B is a sectional view taken along the line C-C', and FIG. 1C is a perspective view.

FIG. 3A is a plan view, FIG. 3B is a sectional view taken along the line E-E', and FIG. 3C is a perspective view.

FIG. 5A is a sectional view taken along the line F-F' of FIG. 4D, and FIG. 5B is a sectional view taken along the line G-G' of FIG. 4D.

FIG. 8A is a plan view, FIG. 8B is a sectional view taken along the line A-A', and FIG. 8C is a perspective view.

DETAILED DESCRIPTION OF THE INVENTION

Embodiments of the present invention are described below with reference to the accompanying drawings.
[First Embodiment]

Figure 1A:
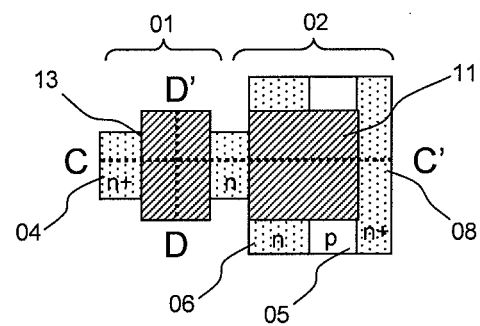
FIGS. 1A to 1C are diagrams illustrating an EEPROM of the present invention.
Figure 1B:
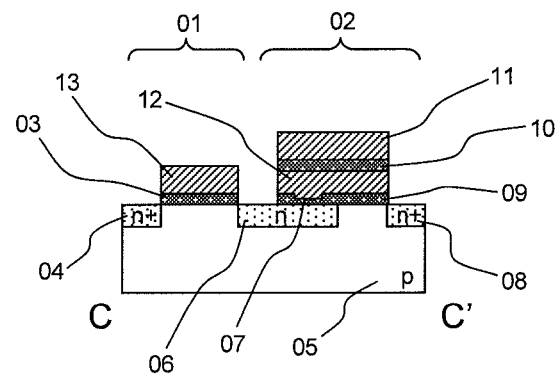
Figure 1C:
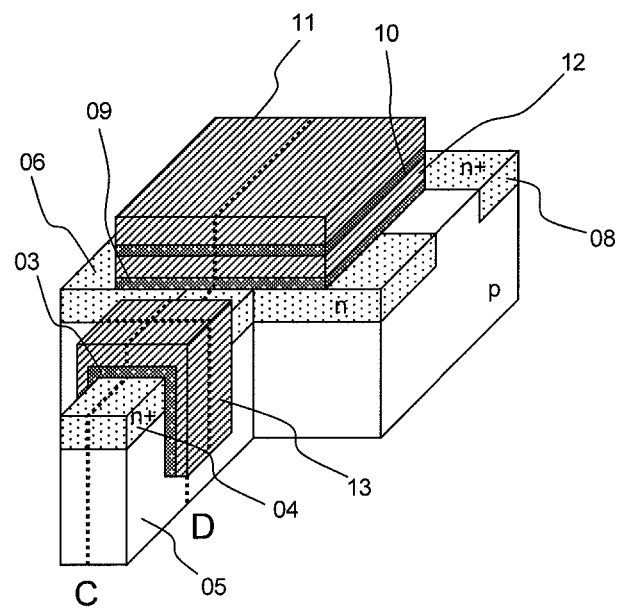

FIGS. 1A to 1C are diagrams illustrating an EEPROM according to a first embodiment of the present invention. FIG. 1A is a plan view, FIG. 1B is a sectional view taken along the line C-C', and FIG. 1C is a perspective view.

Figure 8A:
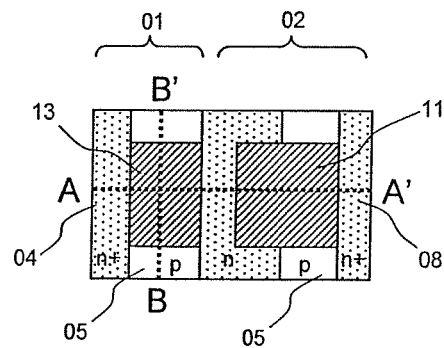
FIGS. 8A to 8C are diagrams illustrating a related-art EEPROM.
Figure 8B:
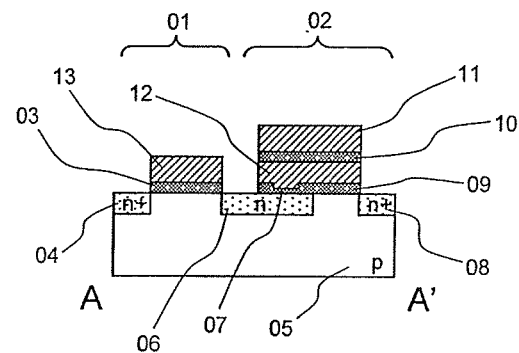
Figure 8C:
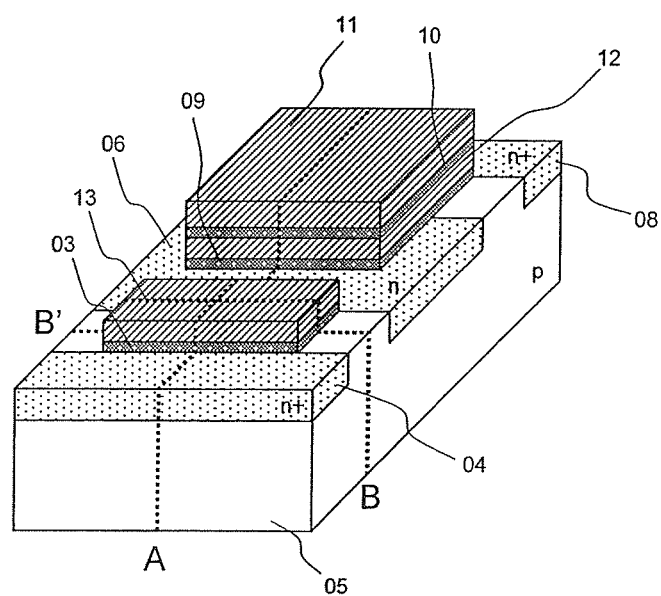

The EEPROM of the present invention includes, similarly to the related-art EEPROM that is illustrated in FIGS. 8A to 8C, a memory main body portion 02 and a select gate transistor portion 01 for selecting the memory main body portion 02. The basic operation principle of the EEPROM of FIGS. 1A to 1C is the same as that of the related-art EEPROM described above, and the sectional view of FIG. 1B is also the same as FIG. 8B. The difference is that the select gate transistor portion 01 of the present invention is formed of a fin-shaped single-crystal semiconductor thin film that stands like a wall.

The select gate transistor portion is formed of a fin-shaped single-crystal semiconductor thin film created by a process in which a p-type silicon substrate 05 is thinned. The p-type silicon substrate 05 has a board-like shape along a channel direction of the select gate transistor. A gate oxide film 03 of the select gate transistor is bent over and overhangs an upper surface and both side surfaces of the board-like p-type silicon substrate 05. A gate electrode 13 is formed on the surfaces of the gate oxide film 03 along the bent gate oxide film 03. The gate oxide film 03 and the gate electrode 13 are shaped so as to bend along and overhang the thinned fin-shaped single-crystal semiconductor thin film. A surface of the single-crystal semiconductor thin film, which is held in contact with the gate oxide film 03 under the bent gate electrode 13, serves as a channel region. A drain n+ region 04 and a tunnel drain n region 06 are formed on a upper surface and side surfaces of the fin-shaped single-crystal semiconductor thin film on both sides of the gate electrode 13, respectively. The notation "n+" signifies a higher impurity concentration relative to the impurity concentration in a region notated simply by "n".

In the memory main body portion 02, a floating gate 12 is formed on top of a gate oxide film 09, which stretches from the top of the tunnel drain n region 06 to an edge of a source n⁺ region 08. An insulating film 10 is formed on a upper surface of the floating gate 12, and a control gate 11 is formed above the floating gate 12 with the insulating film 10 interposed therebetween. A tunnel insulating film 07 that is thinner than the gate oxide film 09 is further formed in a part of the gate oxide film 09 between the floating gate 12 and the tunnel drain n⁺ region 06. The tunnel insulating film 07 is an insulating film that allows a tunnel current to flow, and may be a silicon oxide film or an insulating film formed by nitrization of a silicon oxide film.

Figure 2A:
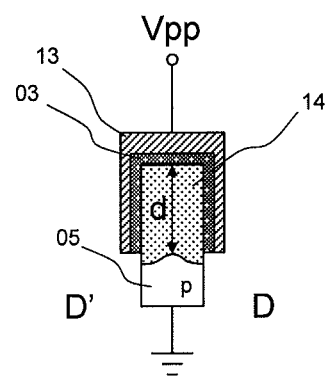
FIG. 2A is a sectional view taken along the line D-D' of FIG. 1A, which illustrates the EEPROM of the present invention.
Figure 2B:
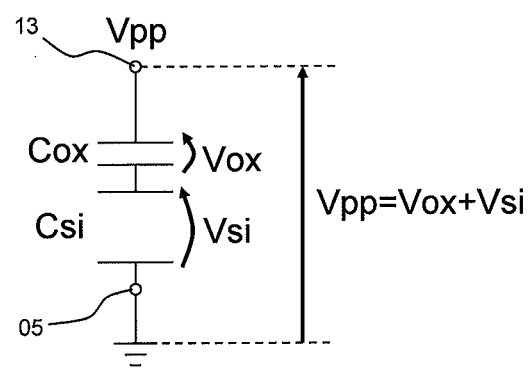
FIG. 2B illustrates an equivalent circuit of FIG. 2A.
Figure 9A:
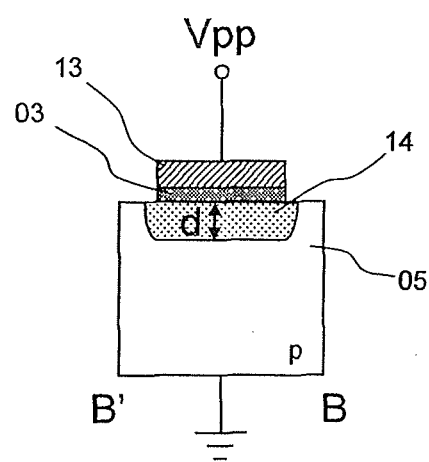
FIGS. 9A and 9B are sectional views taken along the line B-B' of FIG. 8A, which illustrate the related-art EEPROM.
Figure 9B:
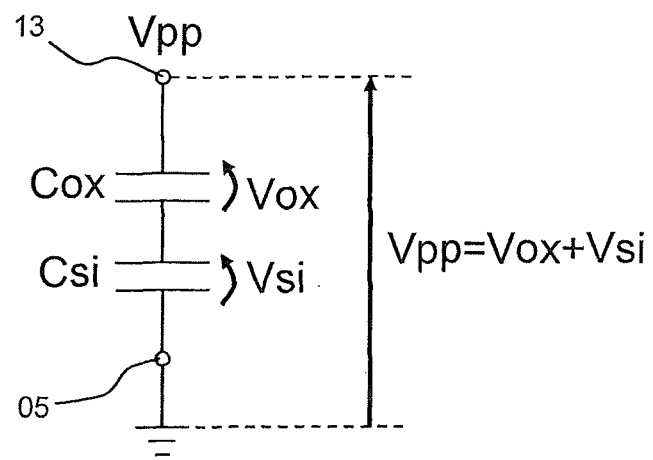
Figure 10:
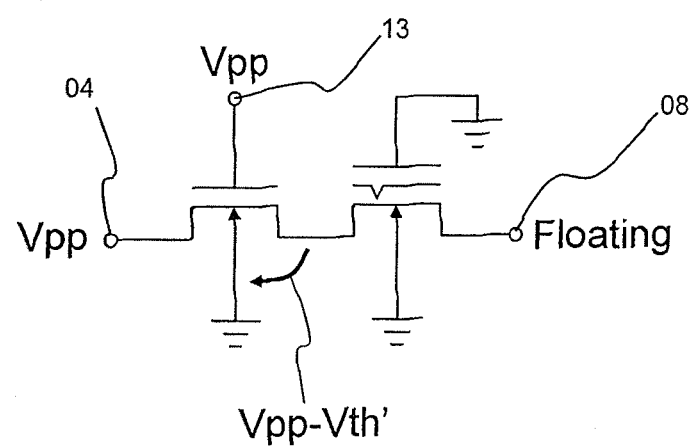
FIG. 10 illustrates an equivalent circuit for a write in the "0" state in the related-art EEPROM.

FIG. 2A is a sectional view of the select gate transistor of FIGS. 1A to 1C (a sectional view taken along the line D-D'). FIG. 2B illustrates an equivalent circuit of FIG. 2A. Unlike the related art of FIGS. 9A and 9B, the gate electrode 13 of FIG. 2A covers not only the upper surface of the channel but also the side surfaces of the channel. The interior of the semiconductor substrate 05, which is a single-crystal semiconductor thin film surrounded by the gate electrode 13, is in a completely depleted state where the entire single-crystal semiconductor thin film is depleted. This extends the width d of the depletion layer to edges in the depth direction of the side surfaces of the gate electrode 13, and thus Csi can be formed extremely smaller than in related art. The rise in Vth due to the back gate effect can thus be prevented and the problem described above is solved. FIG. 2B schematically illustrates that d increases (the capacity decreases) at Csi.

For the same reason, an S value that indicates sub-threshold characteristics of the select gate transistor is made extremely small, which allows Vth of the select gate transistor to be lowered and accordingly allows the minimum operating voltage to be lowered.

While the above description takes a select gate transistor as an example, the same effects can be obtained by applying the present invention to a MOS transistor that is connected in series in a location between the exit of a booster circuit and a control gate.

[Second Embodiment]

Figure 3A:
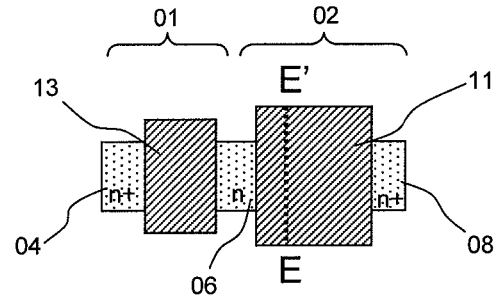
FIGS. 3A to 3C are diagrams illustrating another EEPROM of the present invention.
Figure 3B:
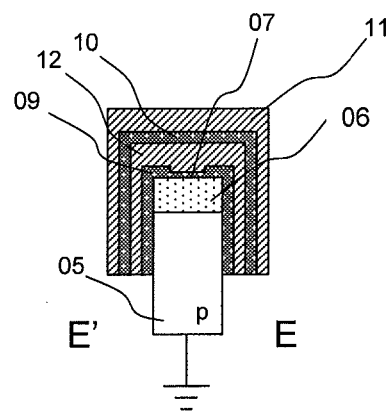
Figure 3C:
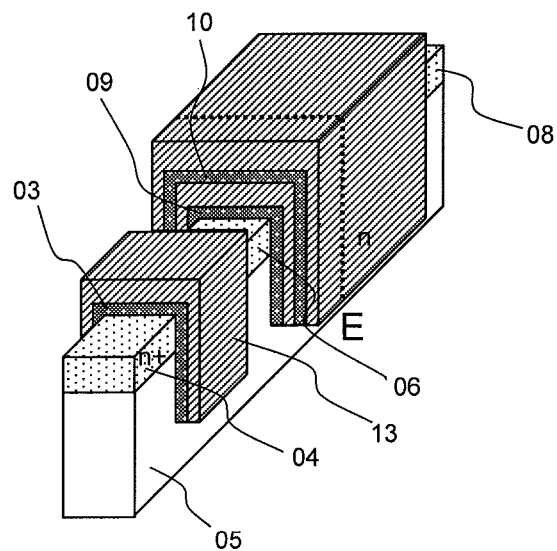

A second embodiment of the present invention is described with reference to FIGS. 3A to 3C. The second embodiment is a modification of the EEPROM of FIGS. 1A to 1C according to the first embodiment, and is obtained by forming the memory main body portion 02 into a fin shape as well. FIG. 3A is a plan view, FIG. 3B is a sectional view taken along the line E-E', and FIG. 3C is a perspective view. Sectional views of the structure of FIGS. 3A to 3C that are taken along the line C-C', which runs from the drain n⁺ region 04 of FIGS. 1A to 1C toward the source n⁺ region 08, and the line D-D', which runs along the width direction of the select gate, are the same as those in the first embodiment, and are therefore omitted.

As illustrated in FIG. 3A, the memory main body portion 02 in this embodiment is formed on surfaces of a fin-shaped single-crystal semiconductor thin film, which forms the p-type silicon substrate 05 thinned to have the same thickness as that of the select gate transistor portion 01. As is understood from FIGS. 3B and 3C, the gate oxide film 09 is formed so as to stretch over the tunnel drain n region 06 and the channel region of the memory main body portion 02 that are formed on surfaces of the fin-shaped single-crystal semiconductor thin film. The tunnel insulating film 07 that is thinner than the gate oxide film 09 is formed in a part of the gate oxide film 09. The floating gate 12 is formed so as to cover surfaces of the gate oxide film 09 and the tunnel insulating film 07. The insulating film 10 is formed on surfaces of the floating gate 12, and the control gate 11 is formed above the floating gate 12 with the insulating film 10 interposed therebetween.

This structure reduces leakage that results from a reduction in the S value of the memory main body portion 02, and an effect of improving the ON/OFF ratio of the memory that facilitates circuit design is obtained. In addition, a disturbance reducing effect is obtained as well.

[Third Embodiment]

A method of manufacturing the EEPROM of the first embodiment that has a fin shape only in the select gate is described next with reference to FIGS. 4A to 4D.

Figure 4A:
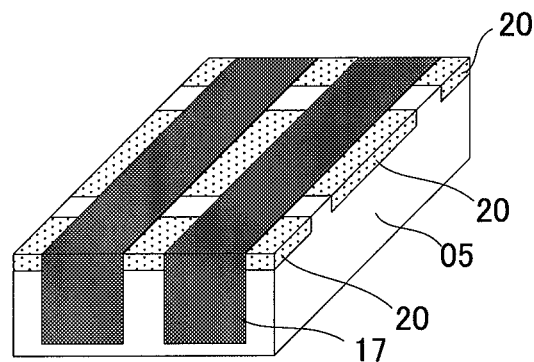
FIGS. 4A to 4D are diagrams illustrating a method of manufacturing an EEPROM according to the present invention.

First, ion implantation or the like is used to form a plurality of n⁻ regions 20 in parallel on the p-type semiconductor substrate 05 as illustrated in FIG. 4A. The notation "n⁻" indicates the relative level of the n-type impurity concentration, which satisfies a relation n⁻<n<n⁺. Thereafter, a plurality of trenches that can serve as shallow trench isolation (STI) regions are formed so as to be orthogonal to the n⁻ regions 20. STI internal oxide films 17 are embedded in concave portions of the trenches. The step of forming the n regions and the step of forming the STI regions may be switched with each other in the order.

Figure 4B:
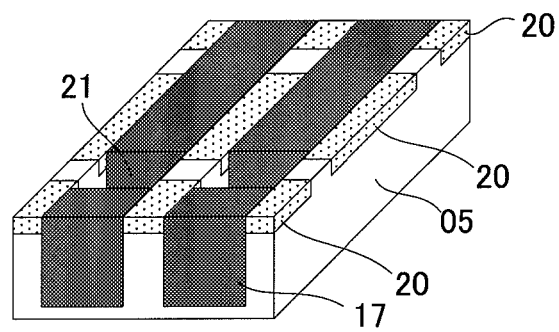
Figure 4C:
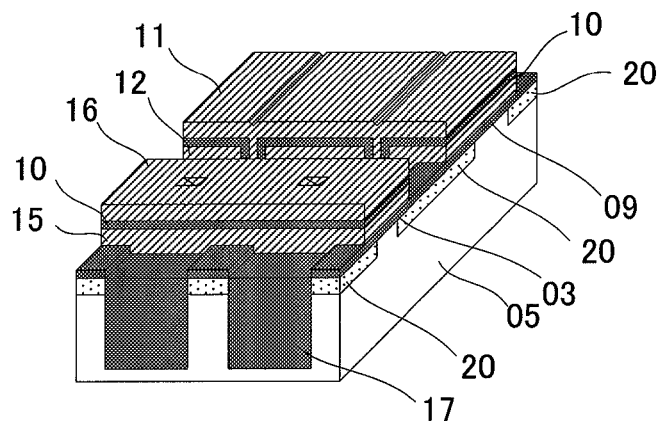

Next, as illustrated in FIG. 4B, the STI internal oxide films are partially removed by etching to form a fin-shaped single-crystal semiconductor thin film. The select gate is formed along the regions from which the STI internal oxide films 17 have been removed. At this point, the STI internal oxide films 17 may or may not remain at the bottom of the regions from which the STI internal oxide films 17 have been removed. FIG. 4C is a diagram illustrating a state where the select transistor portion and the gate electrode of the memory main body portion have been formed. The select transistor portion is on the near side of FIG. 4C, and the memory main body portion is on the far side of FIG. 4C. The manufacturing method up through a step where this state is reached is described. In the select transistor portion, the select gate oxide film 03, a lower select gate 15, the insulating film 10, and an upper select gate 16 are formed in order by deposition on a surface of the p-type semiconductor substrate 05. In the memory main body portion, the gate oxide film 09 of the memory main body portion is formed by deposition on the surface of the p-type semiconductor substrate 05, and then the tunnel insulating film 07 of FIG. 1B, which cannot be seen in FIGS. 4A to 4D, is formed. On the gate oxide film 09 of the memory main body portion, the floating gate 12, the insulating film 10, and the control gate 11 are formed in order by deposition.

The select gate oxide film 03 is formed by the same deposition process as the gate oxide film 09 of the memory main body portion, and then the select transistor portion and the memory main body portion are separated from each other by etching. The same applies to the lower select gate 15 and the floating gate 12, to the insulating film 10 of the select gate transistor portion and the insulating film 10 of the memory main body portion, and to the upper select gate 16 and the control gate 11. The select gate oxide film 03 and the memory main body portion's gate oxide film 09 in FIGS. 4A to 4D are supposed to be a thermally oxidized film, and the oxide film in FIGS. 4A to 4D therefore grows only in portions where the p-type semiconductor substrate 05 is exposed. Alternatively, this gate oxide film may be a deposition film.

Figure 4D:
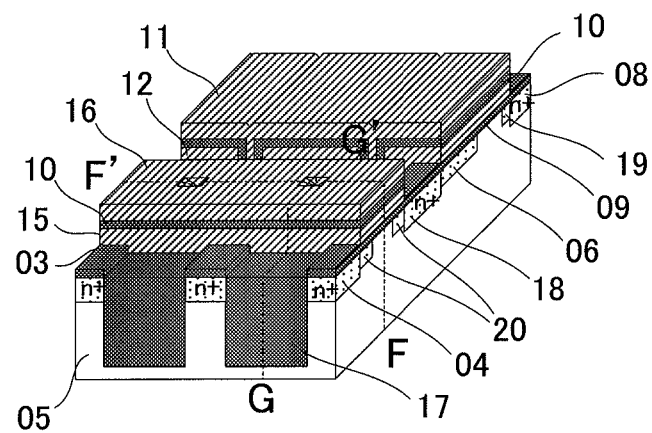

Lastly, as illustrated in FIG. 4D, $n^+$ regions are formed by ion implantation or the like through self-alignment to form the drain $n^+$ region 04, an intermediate $n^+$ region 18, and the source $n^+$ region 08.

While the select gate transistor portion in FIGS. 1A to 1D is a single layer, the select gate in FIGS. 4A to 4D, which is formed by the same processes as the floating gate and the control gate, has a two-layer structure that includes the lower select gate 15 and the upper select gate 16. The lower select gate 15 and the upper select gate 16 can be connected electrically inside the drawings or outside the drawings. A source n region 19 that is not illustrated in FIGS. 1A to 1C is provided as a contrivance to prevent the channel length of the memory cell portion from changing even when a mask is misaligned. The source n region 19 is unnecessary in the case where the channel length is allowed to change. The intermediate $n^+$ region 18 that is also not found in FIGS. 1A to 1C is simply a byproduct of forming the $n^+$ regions through self-alignment. The memory operates without the intermediate $n^+$ region 18, but, with the intermediate $n^+$ region 18, the parasitic resistance decreases and the ON/OFF ratio accordingly improves.

Figure 5A:
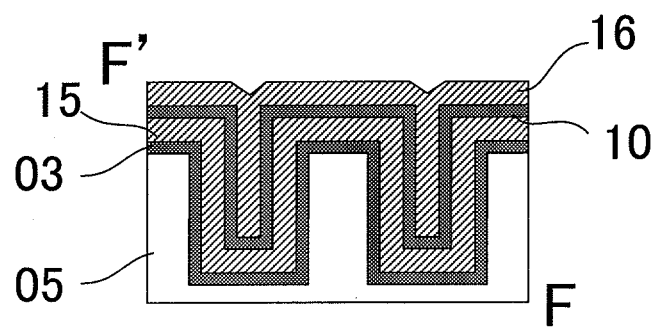
FIGS. 5A and 5B are diagrams illustrating the EEPROM of the present invention.

The fin-shaped structure that is one of the points of the present invention is visible in a sectional view taken along the line F-F' of FIG. 4D. The sectional view is illustrated in FIG. 5A. The lower select gate 15 and the upper select gate 16, which are embedded in the p-type semiconductor substrate 05 with the select gate oxide film 03 interposed between the substrate and the select gate, give the p-type semiconductor substrate 05 a fin shape. The select transistor portion thus has a fin shape in this embodiment, thereby forming the structure of FIGS. 1A to 1C.

The n regions 20 of the select gate transistor portion in FIG. 4D, which are not illustrated in FIGS. 1A to 1C, are lightly doped drains (LDDs) that have an effect of improving the withstand voltage. In addition to the withstand voltage improving effect, the n regions 20 have an effect of eliminating a plane channel transistor parasitic to the select gate transistor portion. Details of this effect are described below.

Figure 5B:
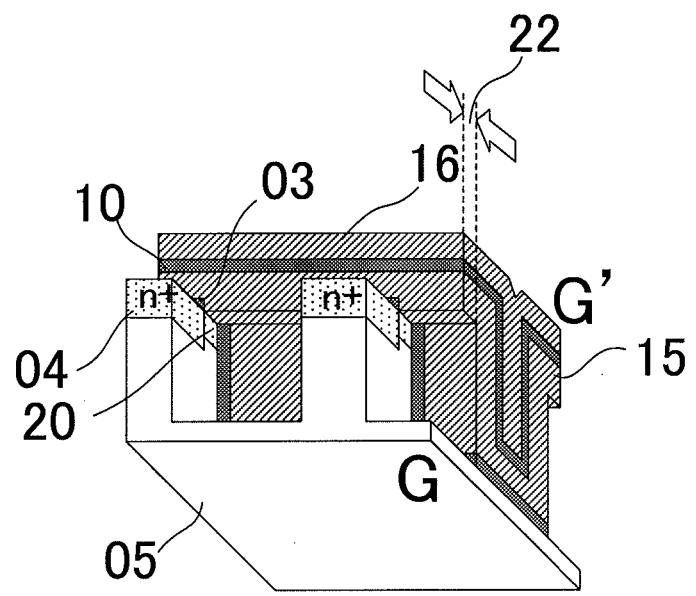

FIG. 5B is a view that looks up to a G-G' section of FIG. 4D from the lower right corner. For the better understanding of the drawing, oxide films that are not covered by the gate electrode are all removed from FIG. 5B. As can be seen in FIG. 5B, an overhang 22 that is as deep as the mask alignment margin is located in the gate portion of the select gate transistor portion. The overhang 22 is formed so as to extend in the direction of the drain $n^+$ region 04 on a surface layer of the fin-shaped single-crystal semiconductor thin film and overlap with the single-crystal semiconductor thin film. If the n regions 20 are not formed, a parasitic plane channel transistor is accidentally formed immediately under the overhang 22. In other words, parasitic plane channel transistors are unintendedly connected in series in front of and behind a fin-shaped transistor, which is intended to be formed, with the result that the effects of the present invention cannot be obtained fully. Forming the n regions 20 on a surface of the p-type semiconductor substrate 05 that is immediately under the overhang 22 changes channel regions of the parasitic plane channel transistors into drain regions or source regions, thereby eliminating the parasitic plane channel transistors.

The n regions 20 of the select gate transistor portion do not need to be formed in the case where the lateral expansion of the drain $n^+$ region 04 and the intermediate $n^+$ region 18 through thermal diffusion covers a distance equal to or greater than the depth of the overhang 22.

[Fourth Embodiment]

Figure 6A:
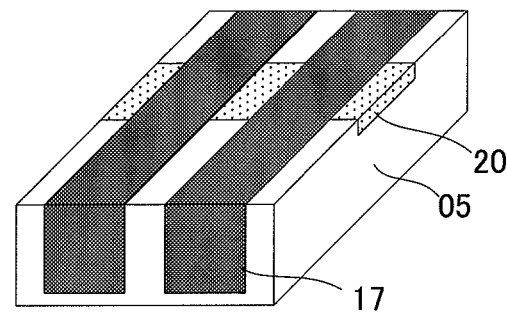
FIGS. 6A to 6D are diagrams illustrating another method of manufacturing an EEPROM according to the present invention.
Figure 6B:
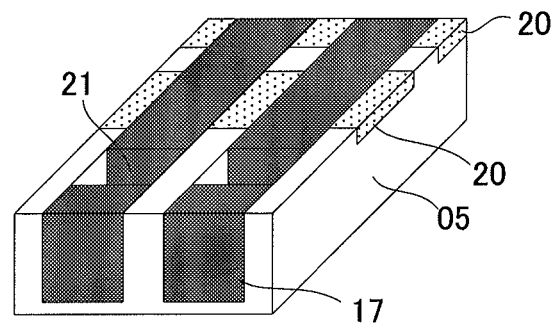

Another manufacturing method in which the above parasitic plane channel transistors of the select gate transistor portion are not formed is described as a fourth embodiment of the present invention, with reference to FIGS. 6A to 6D. FIGS. 6A and 6B are substantially the same as FIGS. 4A and 4B. FIGS. 6A and 6B do not include the n regions 20 in a region that serves as the select gate transistor portion because the parasitic plane channel transistors are not formed and the n regions 20 are accordingly unnecessary. As a matter of course, the n regions 20 of the select gate transistor portion may be formed in the fourth embodiment as in the third embodiment.

Figure 6C:
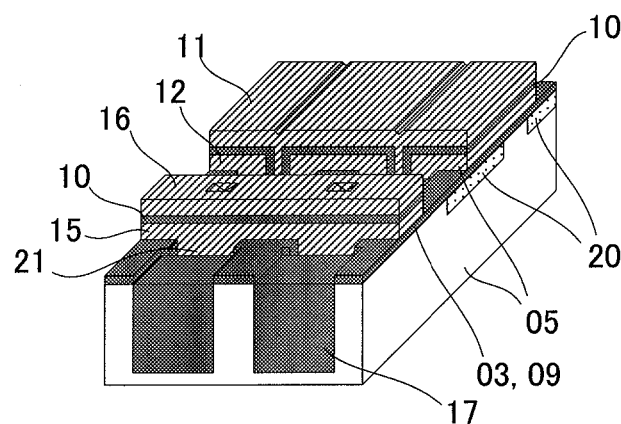

A large difference from the third embodiment is FIG. 6C. After a film that forms the gate portion is formed by deposition as in FIG. 4C, the forming of the overhang 22 of FIG. 5B is avoided by etching so that STI concave portions 21 are partially exposed. While only the STI concave portions 21 on the drain $n^+$ region 04 side are illustrated in FIG. 6C, the STI concave portions 21 on the intermediate $n^+$ region side are also exposed.

Figure 6D:
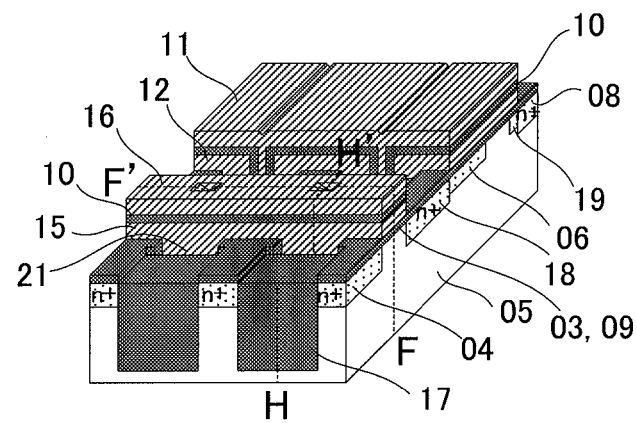

Lastly, as illustrated in FIG. 6D, $n^+$ regions are formed by self-alignment with the use of ion implantation that is performed through the gate oxide films 03 and 09. The drain $n^+$ region 04, the intermediate $n^+$ region 18, and the source $n^+$ region 08 are thus formed.

The fin-shaped structure that is one of the points of this patent application is visible in a sectional view taken along the line F-F' of FIG. 6D. The sectional view has the same structure as FIG. 5A. The select gate transistor portion thus has a fin shape in this embodiment, thereby forming the structure of FIGS. 1A to 1C.

Figure 7A:
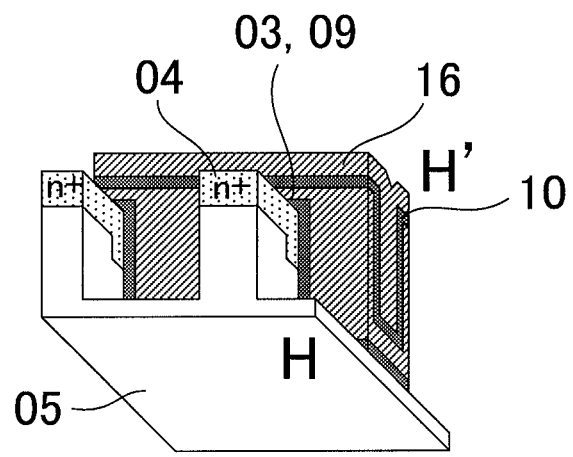
FIGS. 7A and 7B are diagrams illustrating the EEPROM of the present invention, and are sectional views taken along the line H-H' of FIG. 6D.

The parasitic plane channel transistors in the select gate transistor portion, which are another point of this patent application, are as illustrated in FIG. 7A. FIG. 7A is a view that looks up to an H-H' section of FIG. 6D from the lower right corner. For the better understanding of the drawing, oxide films that are not covered by the gate electrode are all removed from FIG. 7A. Because the overhang 22 of FIG. 5B is not included, there are no parasitic plane channel transistors, and the effects of this patent application can therefore be fully obtained with this structure.

Figure 7B:
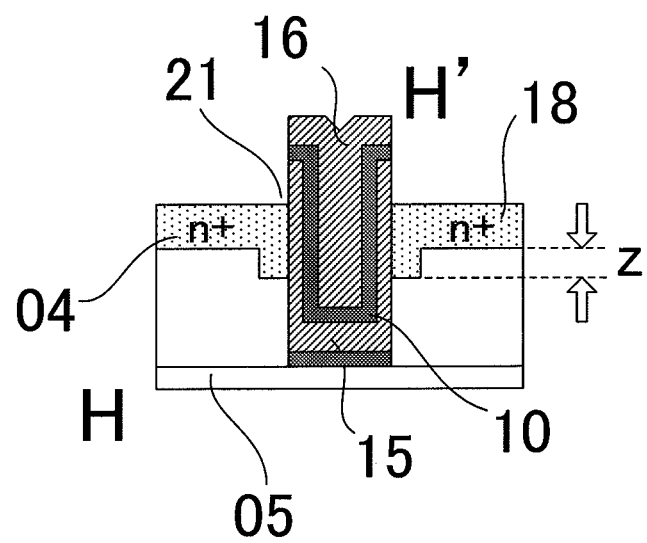

FIG. 7B is the sectional view taken along the line H-H'. In FIG. 7B where the STI concave portions 21 are exposed as illustrated in FIG. 6C, the drain $n^+$ region 04 and the intermediate $n^+$ region 18 in regions where the STI concave portions 21 are exposed can be formed deeper by a length z of FIG. 7B by employing angled ion implantation when the $n^+$ regions are formed by ion implantation in FIG. 6D. This enables electric charges flowing in the fin-shaped transistor to use the channel at a deeper depth, which enhances the driving ability. As a result, an effect of improving the ON/OFF ratio is obtained.

The methods of manufacturing the EEPROM of FIGS. 1A to 1C have been described in the embodiment illustrated in FIGS. 4A to 4D and the embodiment illustrated in FIGS. 6A to 6D. Obviously, the same manufacturing methods can be used to obtain the EEPROM structure of FIGS. 3A to 3C by forming the STI concave portions of FIG. 4B and FIG. 6B in the memory portion of FIGS. 3A to 3C.

What is claimed is:

1. A semiconductor memory device, comprising:
a select transistor portion comprising:
- a first fin-shaped single-crystal semiconductor thin film formed of a semiconductor substrate of a first conductivity type;
- a drain region of a second conductivity type formed on a surface of the first fin-shaped single-crystal semiconductor thin film;
- a tunnel drain region of the second conductivity type formed on the surface of the first fin-shaped single-crystal semiconductor thin film apart from the drain region; and
- a select gate formed between the drain region and the tunnel drain region, the select gate overlying an upper surface and side surfaces of the first fin-shaped single-crystal semiconductor thin film with a select gate oxide film interposed between the select gate and the first fin-shaped single-crystal semiconductor thin film,
- wherein a region lower in concentration than that of the drain region is formed on the upper surface and side surfaces of the first fin-shaped single-crystal semiconductor thin film under the select gate; and a memory transistor portion comprising:
- a second fin-shaped single-crystal semiconductor thin film formed of the semiconductor substrate;
- a source region of the second conductivity type formed on a surface of the second fin-shaped single-crystal semiconductor thin film;
- a floating gate formed above the second fin-shaped single-crystal semiconductor thin film with a gate oxide film interposed between the second fin-shaped single-crystal semiconductor thin film and the floating gate, the gate oxide film being spaced from and not contacting the select gate oxide film and being disposed on a surface of the tunnel drain region and extending from the surface of the tunnel drain region to an edge of the source region, the gate oxide film being formed on an upper surface and side surfaces of the second fin-shaped single-crystal semiconductor thin film, and the part of the gate oxide film disposed on the surface of the tunnel drain region comprising a tunnel insulating film; and
- a control gate formed above the floating gate with an insulating film interposed between the floating gate and the control gate.

2. A semiconductor memory device according to claim 1, wherein the select gate comprises a lower select gate and an upper select gate that is electrically connected to the lower select gate.

* * * * *